(12) United States Patent
Komuro et al.

(10) Patent No.: US 12,719,484 B2
(45) Date of Patent: Aug. 25, 2026

(54) REAL-TIME CLOCK GENERATION DEVICE AND REAL-TIME CLOCK GENERATION METHOD

(71) Applicant: MegaChips Corporation, Osaka (JP)

(72) Inventors: Takeaki Komuro, Osaka (JP); Keisuke Kawanishi, Osaka (JP); Shingo Adachi, Osaka (JP)

(73) Assignee: MEGACHIPS CORPORATION, Osaka (JP)

( * ) Notice: Subject to any disclaimer, the term of this patent is extended or adjusted under 35 U.S.C. 154(b) by 45 days.

(21) Appl. No.: 18/988,939

(22) Filed: Dec. 20, 2024

(65) Prior Publication Data

US 2025/0253831 A1 Aug. 7, 2025

(30) Foreign Application Priority Data

Feb. 6, 2024 (JP) ................................ 2024-016537

(51) Int. Cl.

| | |
|---|---|
| ***H03L 7/24*** | (2006.01) |
| ***G06F 1/08*** | (2006.01) |
| ***G06F 1/12*** | (2006.01) |
| ***G06F 1/14*** | (2006.01) |
| ***H03L 7/00*** | (2006.01) |

(52) U.S. Cl.

CPC .................. *H03L 7/24* (2013.01); *G06F 1/08* (2013.01); *G06F 1/12* (2013.01); *G06F 1/14* (2013.01); *H03L 7/00* (2013.01)

(58) Field of Classification Search

None

See application file for complete search history.

(56) References Cited

U.S. PATENT DOCUMENTS

| | | | | |
|---|---|---|---|---|
| 6,885,254 B2 * | 4/2005 | Kranz | ........................ | H03L 1/00 331/74 |
| 6,961,287 B2 * | 11/2005 | Jung | ........................ | G04G 3/00 368/155 |
| 7,154,344 B2 * | 12/2006 | Thies | ...................... | H03L 7/197 331/25 |

(Continued)

FOREIGN PATENT DOCUMENTS

| | | |
|---|---|---|
| JP | 2003-270369 A | 9/2003 |
| JP | 5666098 B2 | 2/2015 |
| WO | 2017/149978 A1 | 9/2017 |

*Primary Examiner* — Thomas J. Hiltunen
(74) *Attorney, Agent, or Firm* — XSENSUS LLP

(57) ABSTRACT

A first ring oscillator outputs a reference clock signal. A table acquirer acquires a control-value table representing a correspondence between time zones in which the first ring oscillator operates and division ratios of the reference clock signal. In accordance with the control-value table, a divider generates an RTC signal by changing a division ratio of the reference clock signal for each time zone in which the first ring oscillator operates. During execution of calibration of the control-value table, a second ring oscillator outputs a measurement clock signal that oscillates more accurately than the reference clock signal. A frequency measurer measures a frequency of the RTC signal based on the measurement clock signal. In a case in which a frequency of the RTC signal exceeds an allowable error, an update determiner updates at least part of division ratios in the control-value table.

15 Claims, 9 Drawing Sheets

(56) References Cited

U.S. PATENT DOCUMENTS

| | | | | |
|---|---|---|---|---|
| 7,797,118 | B2 * | 9/2010 | Ashburn, Jr. | G06F 1/14 331/46 |
| 9,240,793 | B2 * | 1/2016 | Malpass | H03L 1/022 |
| 9,276,586 | B2 * | 3/2016 | Yasukawa | H03L 7/00 |
| 9,628,096 | B2 * | 4/2017 | Toriumi | H03L 7/1976 |
| 10,511,315 | B1 * | 12/2019 | Sarda | H03K 23/667 |
| 11,086,353 | B2 * | 8/2021 | Huang | H03M 3/30 |
| 2009/0231048 | A1 | 9/2009 | Natarajan et al. | |

* cited by examiner 130
200
120
100
110
60
EXTERNAL POWER SUPPLY
400
EXTERNAL MEASUREMENT DEVICE
500
REFERENCE VOLTAGE SOURCE
70
RING OSCILLATOR
80
RING OSCILLATOR
90
RAM
40
POINT-IN-TIME CALCULATOR
104
DIVIDER
103
FREQUENCY MEASURER
102
SELECTOR
101
BUS
STORAGE DEVICE
10
CPU
20
ROM
30
COMMUNICATION I/F
50
COMMUNICATION CHIP
300
ADC CONTROLLER
63
ADC
62
TEMPERATURE SENSOR
61

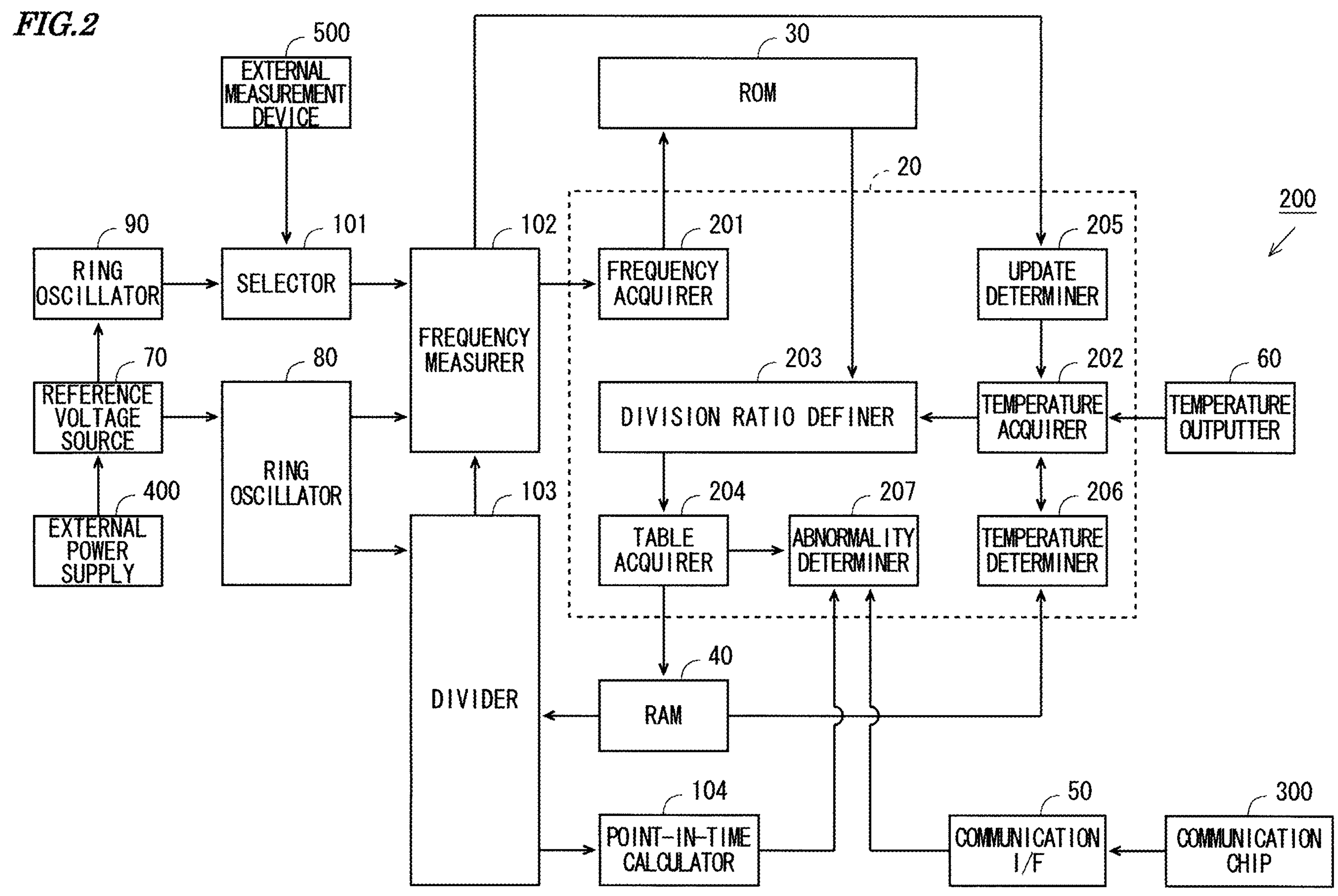
FIG.2
500
EXTERNAL MEASUREMENT DEVICE
30
ROM
20
200
90
RING OSCILLATOR
101
SELECTOR
102
FREQUENCY MEASURER
201
FREQUENCY ACQUIRER
205
UPDATE DETERMINER
70
REFERENCE VOLTAGE SOURCE
80
RING OSCILLATOR
203
DIVISION RATIO DEFINER
202
TEMPERATURE ACQUIRER
60
TEMPERATURE OUTPUTTER
400
EXTERNAL POWER SUPPLY
103
204
TABLE ACQUIRER
207
ABNORMALITY DETERMINER
206
TEMPERATURE DETERMINER
40
DIVIDER
RAM
104
POINT-IN-TIME CALCULATOR
50
COMMUNICATION I/F
300
COMMUNICATION CHIP

REAL-TIME CLOCK GENERATION DEVICE AND REAL-TIME CLOCK GENERATION METHOD

CROSS-REFERENCE TO RELATED APPLICATION

The present application claims priority from Japanese Application Number 2024-016537 filed in Japan on Feb. 6, 2024, the contents of which are incorporated herein by reference.

BACKGROUND

Technical Field

The present disclosure relates to a technique for generating a real-time clock.

Description of Related Art

A microcomputer mounted on an IoT (Internet of Things) system or the like is provided with a real-time clock. The real-time clock calculates a current point in time by continuously measuring the oscillation of a reference clock. Here, it is known that a quartz crystal resonator oscillates relatively highly accurately. Therefore, a crystal oscillator is normally used as a reference clock (see JP 2003-270369 A, for example).

SUMMARY

The microcomputer mounted on the IoT system or the like is preferably driven for a long period of time by a coin battery. Therefore, the microcomputer is required to have low power consumption. Further, the microcomputer is required to be small and inexpensive.

However, a quartz oscillator is expensive. Further, the size of an oscillation circuit of a crystal oscillator is large, and the power consumption of the oscillation circuit is large. Therefore, when a crystal oscillator is used for a real-time clock, it is difficult to satisfy the conditions required for the microcomputer. On the other hand, in a case in which a crystal oscillator is not used, it is difficult to maintain the accuracy of a real-time clock.

An object of the present disclosure is to generate a real-time clock signal using a device that is configured to have low power consumption, be small and be inexpensive while maintaining accuracy.

A real-time clock generation device according to one aspect of the present disclosure includes a first ring oscillator that outputs a reference clock signal, a table acquirer that acquires a control-value table representing a correspondence between time zones in which the first ring oscillator operates and division ratios of the reference clock signal, a divider that, in accordance with the control-value table, generates a real-time clock signal by changing the division ratio of the reference clock signal for each time zone in which the first ring oscillator operates, a second ring oscillator that, during execution of calibration of the control-value table, outputs a measurement clock signal that oscillates more accurately than the reference clock signal, a frequency measurer that measures a frequency of the real-time clock signal based on the measurement clock signal, and an update determiner that determines whether a frequency of the real-time clock signal measured by the frequency measurer is equal to or smaller than a predetermined allowable error, updates at least part of the division ratios in the control-value table in a case in which the frequency of the real-time clock signal exceeds the allowable error, and ends the calibration in a case in which the frequency of the real-time clock signal is equal to or smaller than the allowable error.

A real-time clock generation method according to another aspect of the present disclosure includes acquiring a control-value table representing a correspondence between time zones in which a first ring oscillator outputting a reference clock signal operates and division ratios of the reference clock signal, in accordance with the control-value table, changing the division ratio of the reference clock signal for each time zone in which the first ring oscillator operates to generate a real-time clock signal, during execution of calibration of the control-value table, measuring a frequency of the real-time clock signal based on a measurement clock signal that is output by a second ring oscillator and oscillates more accurately than the reference clock signal, in a case in which a frequency of the real-time clock signal exceeds an allowable error, updating at least part of the division ratios in the control-value table, and in a case in which a frequency of the real-time clock signal is equal to or smaller than the allowable error, ending the calibration.

With the present disclosure, it is possible to generate a real-time clock signal using a device that is configured to have low power consumption, be small and be inexpensive while maintaining accuracy.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 2 is a functional block diagram for explaining an operation of the RTC generation device;

DETAILED DESCRIPTION

A real-time clock generation device and a real-time clock generation method according to embodiments of the present disclosure will be described below in detail with reference to the drawings. In the following description, a real-time clock is abbreviated as an RTC.

1. Configuration of RTC Generation Device

Figure 1:
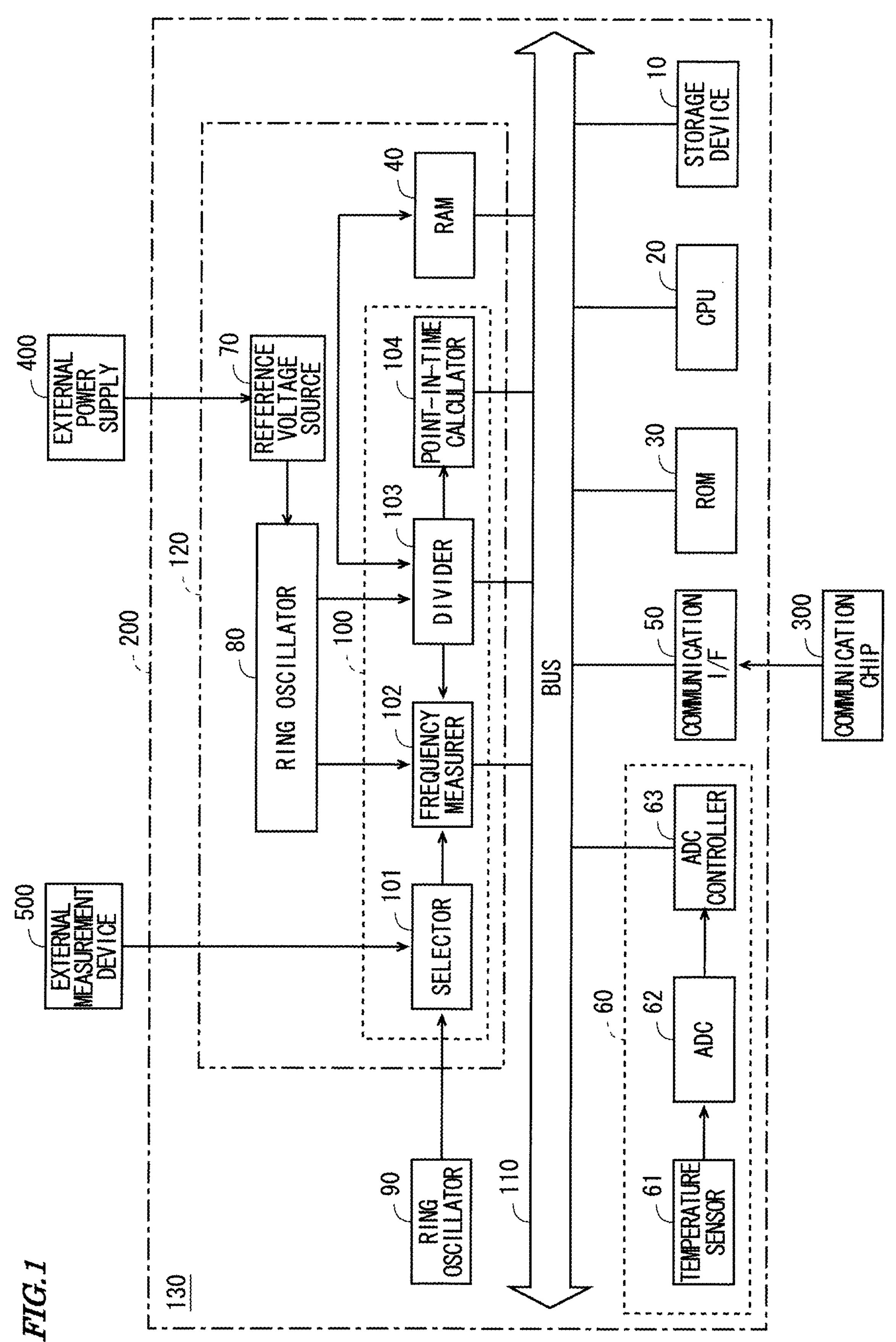
FIG. 1 is a diagram showing the configuration of an RTC generation device according to one embodiment of the present disclosure.

FIG. 1 is a diagram showing the configuration of an RTC generation device according to one embodiment of the present disclosure. In the present example, the RTC generation device 200 is configured as an IC (integrated circuit) chip and provided in a microcomputer. The RTC generation device 200 selectively operates in an active mode and a sleep mode. In the sleep mode, the power consumption of the RTC generation device 200 is reduced as compared with the active mode.

As shown in FIG. 1, the RTC generation device 200 includes a storage device 10, a CPU (Central Processing Unit) 20, a ROM (Read Only Memory) 30, a RAM (Random Access Memory) 40, a communication I/F (interface) 50, a temperature outputter 60, a reference voltage source 70, ring oscillators 80, 90, a circuit portion 100 and a bus 110. The storage device 10, the CPU 20, the ROM 30, the RAM 40, the communication I/F 50, the temperature outputter 60 and the circuit portion 100 are connected to the bus 110.

Further, the RTC generation device 200 is sectioned into a power domain 120 and a power domain 130 which are different from each other. In the power domain 120, the RAM 40, the reference voltage source 70, the ring oscillator 80 and the circuit portion 100 are arranged. In the power domain 130, the storage device 10, the CPU 20, the ROM 30, the communication I/F 50, the temperature outputter 60, the ring oscillator 90 and the bus 110 are arranged.

In the active mode, power is supplied to the power domains 120, 130. In the sleep mode, power is supplied to the power domain 120. Therefore, the elements arranged in the power domain 120 can operate even in the sleep mode. While no power is basically supplied to the power domain 130 in the sleep mode, power is supplied to part of the power domain 130 during initial calibration and during in-use calibration, described below. Therefore, even in the sleep mode, part of the elements arranged in the power domain 130 can operate.

The storage device 10 includes a storage medium such as a semiconductor memory and stores an RTC generation program in advance. The CPU 20 executes the RTC generation program stored in the storage device 10 to execute an RTC generation process. Details of the RTC generation process will be described below. The RTC generation program may be stored in the ROM 30 instead of being stored in the storage device 10. Alternatively, the RTC generation program may be provided in the form of being stored in an external storage medium such as a computer-readable SD memory card, and may be installed in the storage device 10 or the ROM 30 by being read through the communication I/F 50 or the like.

The ROM 30 is formed of a non-volatile memory, for example. The frequency of the ring oscillator 80 during oscillation (the frequency of a reference clock signal, described below) is stored in the ROM 30. Here, the frequency of the ring oscillator 80 varies due to differences in process of manufacturing respective RTC generation devices 200. As such, in the present example, the frequency of the ring oscillator 80 is measured at a specific temperature and stored in the ROM 30 before shipment of the RTC generation device 200.

The RAM 40 is made of a volatile memory, for example, and is used as a work area for the CPU 20. Further, a control-value table is temporarily stored in the RAM 40. The control-value table is generated based on the frequency of the ring oscillator 80 stored in the ROM 30, a temperature output by the temperature outputter 60, and the like, and is used for the control executed by the circuit portion 100. In the control-value table, a control parameter indicating the division ratio for generation of a signal that oscillates at about 1 Hz, obtained when the frequency of the ring oscillator 80 is divided with the division ratio, at an operating temperature of the ring oscillator 80 (an internal temperature of the RTC generation device 200). In the present example, a control parameter includes a setting value of a prescaler or a duty ratio in PWM (Pulse Width Modulation) control. A communication chip 300 can be connected to the communication I/F 50. The communication chip 300 includes a Wi-Fi (Wireless Fidelity) chip, for example. In a case in which the communication chip 300 is connected, the communication I/F 50 acquires information distributed from a server or the like, and outputs the information to the bus 110. The information distributed from the server or the like may include a current point in time. Further, in a case in which the communication chip 300 is connected to the communication I/F 50, the RTC generation program distributed from the server or the like may be installed in the storage device 10 or the ROM 30.

The temperature outputter 60 includes a temperature sensor 61, an ADC (Analog-Digital Converter) 62 and an ADC controller 63. The temperature sensor 61 detects an ambient temperature of the RTC generation device 200. The ADC 62 performs AD (analog-digital) conversion on a temperature value detected by the temperature sensor 61. The ADC controller 63 accumulates, for a certain period, the temperatures that are obtained when the ADC 62 executes the AD conversion, and outputs the accumulated temperatures to the bus 110. The temperatures that have been output to the bus 110 are used for evaluation of an internal temperature of the RTC generation device 200.

An external power supply 400 is connected to the reference voltage source 70. In the present example, the external power supply 400 is a coin battery of the voltage of 3.3 V. The reference voltage source 70 includes a BGR (Band Gap Reference) circuit, for example, and generates a constant voltage (1.2 V in the present example) having a higher stability than that of the external power supply 400 by supply of a voltage from the external power supply 400. The voltage generated by the reference voltage source 70 is supplied to various elements such as the ring oscillators 80, 90.

The ring oscillator 80 is an oscillator in which a plurality of delay elements are coupled in a ring shape, and outputs, to the circuit portion 100, a signal (hereinafter referred to as a reference clock signal) that oscillates when a voltage is supplied. The frequency of the reference clock signal is about 32 kHz, for example. As described above, because a voltage having high stability is supplied to the ring oscillator 80 by the reference voltage source 70, variations in frequencies of the reference clock signal caused by variations in voltages are reduced.

The ring oscillator 90 includes a ring oscillator having a bias circuit, and outputs, to the circuit portion 100, a signal (hereinafter referred to as a measurement clock signal) which oscillates when a voltage is supplied. The frequency of the measurement clock signal is about 32 MHz, for example. Although the power consumption of the ring oscillator 90 is larger than the power consumption of the ring oscillator 80, the accuracy of oscillation of a measurement clock signal is higher than the accuracy of oscillation of a reference clock signal.

The circuit portion 100 includes a large-scale integrated circuit (LSI), for example, and includes a selector 101, a frequency measurer 102, a divider 103 and a point-in-time calculator 104. The ring oscillator 90 is connected to the selector 101. Further, the external measurement device 500 is temporarily connected to the selector 101 when the frequency of a reference clock signal is measured. In the present example, the external measurement device 500 is a tester, and outputs an oscillating signal (hereinafter referred to as an external clock signal). The frequency of an external clock signal is about 32 MHz, for example. The accuracy of oscillation of an external clock signal is higher than the accuracy of oscillation of a measurement clock signal. The selector 101 selects one of a measurement clock signal and an external clock signal, and outputs the selected signal to the frequency measurer 102.

The frequency measurer 102 is connected to the ring oscillator 80. At a specific temperature, the frequency measurer 102 measures the frequency of a reference clock signal by comparing a reference clock signal output by the ring oscillator 80 with an external clock signal output by the selector 101. Specifically, the frequency measurer 102 measures the frequency of a reference clock signal by counting the frequency of an external clock signal per cycle of the reference clock signal. The frequency measurer 102 may measure the frequency of a reference clock signal by counting the frequency of an external clock signal per a plurality of cycles of the reference clock signal and calculating the average value of the frequency of the external clock signal per cycle of the reference clock signal. The frequency measurer 102 outputs the measured frequency of the reference clock signal to the bus 110. The frequency of the reference clock signal that is output to the bus 110 is stored in the ROM 30.

Further, an output signal (RTC signal, described below) of the divider 103 is fed back to the frequency measurer 102. The frequency measurer 102 measures the frequency of the RTC signal by comparing the RTC signal fed back from the divider 103 with a measurement clock signal output by the selector 101. The frequency measurer 102 outputs the measured frequency of the RTC signal to the bus 110. In a case in which the frequency of the RTC signal output to the bus 110 exceeds a predetermined allowable error, at least part of control parameters of the control-value table stored in the RAM 40 is updated.

The divider 103 controls a built-in prescaler, a switching element or the like based on the control-value table stored in the RAM 40, thereby dividing a reference clock signal measured by the frequency measurer 102 and generating a signal (hereinafter referred to as an RTC signal) that oscillates at a frequency close to 1 Hz. Because control parameters based on internal temperatures of the RTC generation device 200 are written in the control-value table, variations in frequencies of the RTC signal caused variations in temperatures are reduced. Because being connected to the RAM 40, the divider 103 can directly access the RAM 40 without using the bus 110 in the sleep mode.

As described above, an RTC signal generated by the divider 103 is fed back to the frequency measurer 102. The feedback of an RTC signal continues until all of the control parameters in the control-value table stored in the RAM 40 are confirmed. Even after all of the control parameters of the control-value table are confirmed, in a case in which temperatures output by the temperature outputter 60 vary largely, the feedback of an RTC signal may be restarted in order to regenerate a control-value table. In the present example, in a case in which an output temperature in regard to a certain point in time of day largely deviates from a temperature written in the control-value table as a temperature at the corresponding point in time, the feedback of an RTC signal is restarted.

The point-in-time calculator 104 continuously acquires the RTC signal generated by the divider 103. Further, the point-in-time calculator 104 calculates a point in time by integrating unit times defined by acquired the RTC signal, and outputs the point in time to the bus 110. The operation mode of the RTC generation device 200 is switched between the active mode and the sleep mode in accordance with an operation schedule designated by a user. Therefore, the point in time output to the bus 110 is used for the switch of the operation mode of the RTC generation device 200.

The user or the like may set an initial point in time in the point-in-time calculator 104 after the RTC generation device 200 is powered on. In this case, the point-in-time calculator 104 continues to update the set point in time based on the frequency of the ring oscillator 80. After the end of the in-use calibration, a point in time calculated by the point-in-time calculator 104 is periodically compared with a distributed point in time, thereby being used for detection of an abnormality of the RTC generation device 200.

2. Operation of RTC Generation Device

FIG. 2 is a functional block diagram for explaining an operation of the RTC generation device 200. As shown in FIG. 2, the RTC generation device 200 includes a frequency acquirer 201, a temperature acquirer 202, a division ratio definer 203, a table acquirer 204, an update determiner 205, a temperature determiner 206 and an abnormality determiner 207 as functions. In the present example, the functions of the RTC generation device 200 are implemented by execution of the RTC generation program by the CPU 20, for example.

Initial calibration and in-use calibration are sequentially executed on the RTC generation device 200. During the initial calibration and during the in-use calibration, the functions of the RTC generation device 200 can operate even in the sleep mode. In the initial calibration, after the RTC generation device 200 is manufactured and before the RTC generation device 200 is shipped, for example, the frequency of a reference clock signal is measured. Specifically, the RTC generation device 200 is arranged in an environment at a specific temperature (25° C., for example). Further, the external measurement device 500 is connected to the selector 101.

In this state, a voltage is supplied from the reference voltage source 70 to the ring oscillator 80, so that the ring oscillator 80 outputs a reference clock signal. The frequency measurer 102 measures the frequency of the reference clock signal using an external clock signal output by the selector 101. The frequency acquirer 201 acquires the frequency of the reference clock signal measured by the frequency measurer 102 and stores the frequency in the ROM 30. Thus, the initial calibration ends. Thereafter, the RTC generation device 200 is shipped.

At the shipping destination of the RTC generation device 200, the RTC generation device 200 operates according to an operation schedule designated by the user. In-use calibration is executed at the time of initial activation of the RTC generation device 200 at the shipping destination of the RTC generation device 200. In the in-use calibration, the temperature acquirer 202 acquires the internal temperature of the RTC generation device 200 in each time zone of one day based on an ambient temperature of the RTC generation device 200 output by the temperature outputter 60 and an operation schedule of the RTC generation device 200 designated by the user. In the present example, the internal temperatures of the RTC generation device 200 are acquired at intervals of one hour.

The internal temperature of the RTC generation device 200 is evaluated based on a value obtained by addition of a temperature of the RTC generation device 200 caused by the power consumption of the RTC generation device 200 to an ambient temperature of the RTC generation device 200. Further, the temperature caused by the power consumption of the RTC generation device 200 is calculated based on a product of the power consumption of the RTC generation device 200 and a known thermal resistance of the RTC generation device 200. The power consumption of the RTC generation device 200 varies according to the operation modes of the RTC generation device 200. In the sleep mode, the power consumption of the RTC generation device 200 is extremely small. Therefore, in the sleep mode, a temperature caused by the power consumption of the RTC generation device 200 may be ignored. In this case, an internal temperature of the RTC generation device 200 is equal to an ambient temperature of the RTC generation device 200.

The division ratio definer 203 acquires the frequency of a reference clock signal stored in the ROM 30. Further, the division ratio definer 203 defines the division ratio of a reference clock signal for generation of a signal that oscillates at approximately 1 Hz for each time zone based on the frequency of the reference clock signal acquired from the ROM 30. In the present example, the division ratio of a reference clock signal for each hour is defined. Further, the division ratio includes an integer division ratio and a decimal division ratio.

Suppose that the frequency of a reference clock signal acquired from the ROM 30 is 32.456 kHz, for example. On the other hand, suppose that the frequency of a measurement clock signal is 32.050 MHz. In this case, the ratio of the frequency of the reference clock signal to the frequency of the measurement clock signal is 987. Therefore, the frequency of the reference clock signal measured using the measurement clock signal is 32472.1378 Hz. Therefore, the integer division ratio for the subject time zone is defined to be 32472.

The defined division ratio is set in the prescaler, so that a signal (hereinafter referred to as an integer division signal) obtained when a reference clock signal is divided by the integer division ratio is generated. The division ratio definer 203 defines a decimal division ratio such that the frequency of an integer division signal for each time zone is further brought closer to 1 Hz with a resolution smaller than the integer division ratio. In the present example, a decimal division ratio is defined as a duty ratio D in the PWM control. Here, the duty ratio D for increasing the frequency of an integer division signal in a negative direction is defined using the following formula (1). On the other hand, the duty ratio D for increasing the frequency of an integer division signal in a positive direction is defined using the following formula (2).

[Formula 1]

$$f_{cal} = f_{pre}(1 - D) \tag{1}$$

[Formula 2]

$$f_{cal} = \frac{f_{pre}}{1 - D} \tag{2}$$

In the formulas (1) and (2), fcal represents the frequency of a signal (that is an RTC signal) generated when a reference clock signal is divided by a decimal division ratio, and is ideally 1 Hz. fpre represents the frequency of an integer division signal. In the above-mentioned example, fpre is 32.456 kHz/32472=0.99950726 Hz. Therefore, in order to make fpre for the subject time zone be closer to 1 Hz, it is necessary to increase the frequency in the positive direction. Therefore, the duty ratio D is defined using the formula (2). Specifically, the duty ratio D for the subject time zone is defined to be about 1/2029. With the duty ratio D, the frequency of an RTC signal after division is 1.000000120 Hz.

The frequencies of the reference clock signal vary due to variations in internal temperatures of the RTC generation device 200. As such, in the present example, the division ratio definer 203 compensates a defined integer division ratio and a defined decimal division ratio further based on the known temperature characteristics of the ring oscillator 80 and the internal temperature of the RTC generation device 200 for each time zone acquired by the temperature acquirer 202. Thus, variations of the reference clock signal caused by variations of the internal temperatures of the RTC generation device 200 are compensated.

The table acquirer 204 generates a control-value table in which the integer division ratio and the decimal division ratio defined by the division ratio definer 203 are written for each time zone for one day, and stores the control-value table in the RAM 40. In the present example, a temperature acquired by the temperature acquirer 202 for each time zone is also written in the control-value table.

In this case, the divider 103 reads the control-value table stored in the RAM 40, and divides a reference clock signal output from the ring oscillator 80 by an integer division ratio and a decimal division ratio corresponding to a current point in time, thereby generating an RTC signal. The RTC signal is generated at all times and continuously output even in a case in which the RTC generation device 200 switches to the sleep mode.

After the control-value table is stored in the RAM 40, the frequency measurer 102 measures the frequencies of the RTC signal for one day output by the divider 103 using a measurement clock signal output by the selector 101. The update determiner 205 determines whether the frequency of an RTC signal for each time zone measured by the frequency measurer 102 (the difference between the frequency of an RTC signal and 1 Hz in the present example) is equal to or smaller than a predetermined allowable error. In a case in which the frequency of an RTC signal for any time zone exceeds an allowable error, the update determiner 205 updates an integer division ratio and a decimal division ratio in the control-value table for the subject time zone. On the other hand, the integer division ratios and the decimal division ratios of the control-value table for other time zones are fixed without being updated.

In the present example, in a case in which the frequency of an RTC signal exceeds the allowable error, the update determiner 205 causes the temperature acquirer 202 to reacquire the internal temperature of the RTC generation device 200 for the same time zone on the next day. In this case, for the subject time zone, an integer division ratio and a decimal division ratio are defined again by the division ratio definer 203. Thus, the integer division ratio and the decimal division ratio in the control-value table for the subject time zone are updated.

In a case in which the frequency of an RTC signal is equal to or smaller than the allowable error for all of the time zones, the update determiner 205 ends in-use calibration. Further, the feedback of an RTC signal from the divider 103 to the frequency measurer 102 is stopped. Also after the end of the in-use calibration, the feedback of an RTC signal from the divider 103 to the frequency measurer 102 may be periodically executed, so that the update determiner 205 may determine whether the frequency of an RTC signal for any time zone is equal to or smaller than the allowable error. In a case in which the frequency of an RTC signal exceeds the allowable error, the above-mentioned in-use calibration may be executed again.

Further, when the installation environment (the installation location or the season, for example) of the RTC generation device 200 changes, the pattern of variations of the internal temperatures of the RTC generation device 200 for one day changes, and thus the generated control-value table may be invalid. As such, also after the end of in-use calibration, the temperature acquirer 202 acquires the ambient temperature of the RTC generation device 200 at a specific point in time from the temperature outputter 60 every day. The temperature determiner 206 determines whether the difference between a temperature acquired by the temperature acquirer 202 and an ambient temperature at the same point in time during execution of the in-use calibration is equal to or smaller than a predetermined threshold value. In a case in which the temperature difference exceeds the threshold value, the above-mentioned in-use calibration is executed again.

In a case in which all of control parameters of a control-value table acquired by the table acquirer 204 are not fixed within a predetermined period after the in-use calibration is started, the abnormality determiner 207 determines that the RTC generation device 200 is abnormal. Further, after the end of the in-use calibration, the abnormality determiner 207 compares a point in time calculated by the point-in-time calculator 104 with a point in time acquired from the communication chip 300 through the communication I/F 50 at predetermined time intervals. In a case in which the comparison result exceeds an allowable error, the abnormality determiner 207 determines that the RTC generation device 200 is abnormal.

Due to deterioration of the RTC generation device 200 over time, the longer a period of time that has elapsed from the date of manufacture of the RTC generation device 200, the higher the probability of occurrence of an abnormality. Therefore, the longer a period of time that has elapsed from the date of manufacture of the RTC generation device 200 is, the shorter the intervals at which the above-mentioned comparison is made may be. For example, the abnormality determiner 207 may make comparison every six months for five years from the manufacturing date of the RTC generation device 200, may make comparison every month for the fifth and subsequent years, and may make comparison every week for the eighth and the subsequent years.

In a case in which determining that the RTC generation device 200 is abnormal, the abnormality determiner 207 notifies the user of the determination. As an example of notification to be made by the abnormality determiner 207, in a case in which the RTC generation device 200 is connected to a display device, a character string indicating that the RTC generation device 200 is abnormal may be displayed on the display device. In a case in which the RTC generation device 200 is connected to a sound output device, a speech representing the similar content may be output, or a warning sound such as a buzzer may be output. In a case in which the RTC generation device 200 is connected to an indication light such as a lamp, the indication light may light up, goes out or blink.

3. RTC Generation Process

An RTC generation process is executed when the CPU 20 executes the RTC generation program, and includes initial calibration, in-use calibration, an update determination process, a temperature determination process and an abnormality determination process. Each of the initial calibration, the in-use calibration, the update determination process, the temperature determination process and the abnormality determination process will be described below with reference to FIG. 2.

Figure 3:
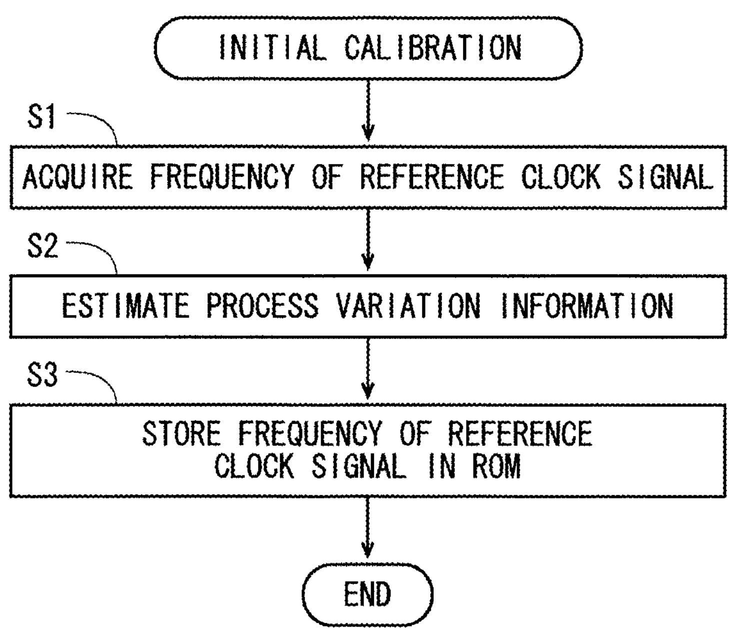
FIG. 3 is a flowchart showing one example of initial calibration executed by a CPU.

FIG. 3 is a flowchart showing one example of initial calibration executed by the CPU 20. In the initial calibration, the frequency measurer 102 measures the frequency of a reference clock signal using an external clock signal output from the external measurement device 500. The frequency acquirer 201 acquires the frequency of a reference clock signal measured by the frequency measurer 102 (step S1).

Next, based on the frequency of the reference clock signal acquired in the step S1, the frequency acquirer 201 estimates process variation information of the ring oscillator 80 (step S2). In the present example, the process variation information is a parameter relating to the threshold voltage of each of a PMOS field effect transistor and an NMOS field effect transistor, and includes "FF," "FS," "SF," "TT" and "SS." "FF" indicates that the threshold voltage of the PMOS is low, and the threshold voltage of the NMOS is low. "FS" indicates that the threshold voltage of the PMOS is low, and the threshold voltage of the NMOS is high. "SF" indicates that the threshold voltage of the PMOS is high, and the threshold voltage of the NMOS is low. "TT" indicates that the threshold voltage of the PMOS is about intermediate, and the threshold voltage of the NMOS is about intermediate. "SS" indicates that the threshold voltage of the PMOS is high, and the threshold voltage of the NMOS is high.

Thereafter, the frequency acquirer 201 stores, in the ROM 30, the frequency of the reference clock signal including the process variation information estimated in the step S2 (step S3). Thus, the initial calibration ends.

Figure 4:
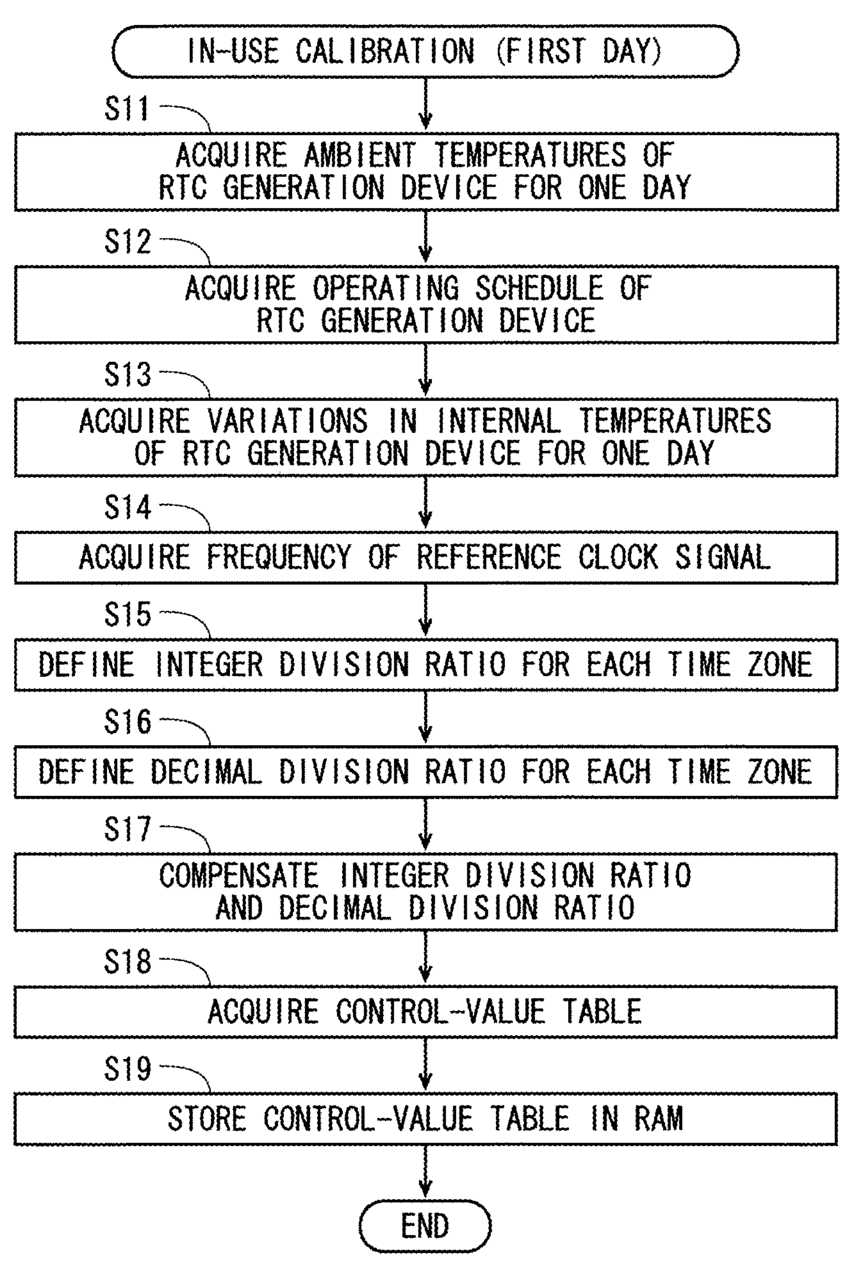
FIG. 4 is a flowchart showing one example of in-use calibration on the first day executed by the CPU.

The in-use calibration is started when the RTC generation device 200 is powered on for the first time after the RTC generation device 200 is shipped. FIG. 4 is a flowchart showing one example of the in-use calibration on the first day executed by the CPU 20. In the in-use calibration on the first day, the temperature acquirer 202 acquires ambient temperatures of the RTC generation device 200 for one day from the temperature outputter 60 (step S11). Further, the temperature acquirer 202 acquires the operation schedule of the RTC generation device 200 (step S12). Either of the steps S11 and S12 may be executed first, or the steps S11 and S12 may be executed at the same time. The temperature acquirer 202 acquires variations in internal temperatures of the RTC generation device 200 for one day based on the ambient temperatures acquired in the step S11 and the operation schedule acquired in the step S12 (step S13).

Next, the division ratio definer 203 acquires the frequency of a reference clock signal from the ROM 30 (step S14). Further, based on the frequency of the reference clock signal acquired in the step S14, the division ratio definer 203 defines the integer division ratio for each time zone (step S15). Subsequently, based on the formula (1) or the formula (2), the division ratio definer 203 defines the decimal division ratio with respect to the integer division signal for each time zone defined in the step S15 (step S16). Thereafter, based on the variations in internal temperatures of the RTC generation device 200 for one day acquired in the step S13, the division ratio definer 203 compensates the integer division ratio defined in the step S15 and the decimal division ratio defined in the step S16 (step S17).

Next, the table acquirer 204 generates a control-value table in which the integer division ratio defined in the step S15 and the decimal division ratio defined in the step S16 are written (step S18). In the present example, the temperatures acquired in the steps S11 and S13 for each time zone, and the integer division ratio and the decimal division ratio compensated in the step S17 are also written in the control-value table. Further, the table acquirer 204 stores the control-value table acquired in the step S18 in the RAM 40 (step S19).

The divider 103 reads the control-value table stored in the RAM 40, thereby dividing a reference clock signal by the compensated integer division ratio and the compensated decimal division ratio to generate an RTC signal. Further, the frequency measurer 102 measures the frequency of the RTC signal using a measurement clock signal. Thus, the in-use calibration on the first day ends. Because it takes about 24 hours to execute the step S11, it takes about one day to execute the steps S11 to S19.

When the RTC generation device 200 is powered on for the first time after the shipment of the RTC generation device 200, the following pre-calibration may be executed by the CPU 20 before the above-mentioned in-use calibration on the first day is started.

In the pre-calibration, an initial point in time is set in the point-in-time calculator 104 by a user or the like of the RTC generation device 200. Therefore, the point-in-time calculator 104 calculates a point in time based on a reference clock and continues to update the set initial point in time. Here, based on a point in time calculated by the point-in-time calculator 104, the abnormality determiner 207 determines whether a predetermined period of time (24 hours in the present example) has elapsed.

In a case in which the predetermined period of time has not elapsed, the abnormality determiner 207 waits until the predetermined period of time elapses. In a case in which the predetermined period of time has elapsed, the abnormality determiner 207 acquires a point in time calculated by the point-in-time calculator 104. Further, the abnormality determiner 207 acquires a point in time distributed by communication from the communication chip 300 through the communication I/F 50. Next, the abnormality determiner 207 determines whether the difference between the calculated point in time and the distributed point in time is equal to or smaller than an allowable error.

In a case in which the difference between the points in time exceeds the allowable error, the frequency measurer 102 measures the frequency of a reference clock signal using a measurement clock signal output by the ring oscillator 90. Therefore, the frequency acquirer 201 acquires the frequency of the reference clock signal measured by the frequency measurer 102. Thereafter, the frequency acquirer 201 updates the frequency of the reference clock signal stored in the ROM 30 with the newly acquired frequency of the reference clock signal. Thereafter, the process returns to the step of determining whether the predetermined period of time has elapsed.

In a case in which the difference between the points in time is equal to or smaller than the allowable error, the abnormality determiner 207 ends the pre-calibration. In a case in which the pre-calibration does not end within a predetermined period of time, the abnormality determiner 207 may determine that an abnormality has occurred in the RTC generation device 200, notify the user of the determination and end the pre-calibration.

Figure 5:
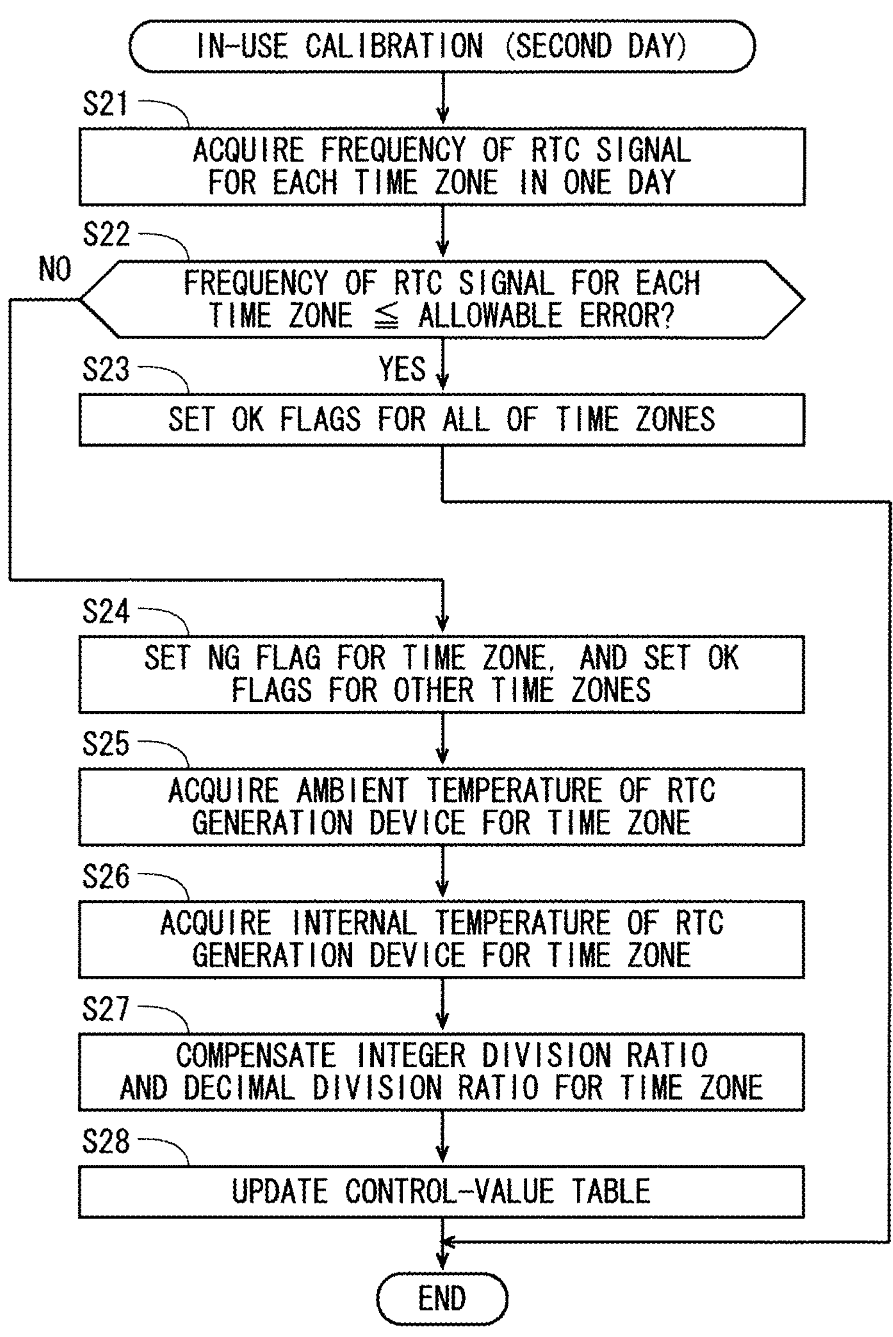
FIG. 5 is a flowchart showing one example of the in-use calibration on the second day executed by the CPU.

After the in-use calibration on the first day ends, the in-use calibration on the second day is executed. FIG. 5 is a flowchart showing one example of the in-use calibration on the second day executed by the CPU 20. In the in-use calibration on the second day, the update determiner 205 acquires the frequency of an RTC signal for each time zone for one day measured by the frequency measurer 102 (step S21). Further, the update determiner 205 determines whether the frequency of the RTC signal for each time zone acquired in the step S21 is equal to or smaller than a predetermined allowable error (step S22).

In a case in which the frequency of the RTC signal for each time zone acquired in the step S21 is equal to or smaller than the allowable error, the update determiner 205 sets an OK flag for each of all of the time zones in the control-value table (step S23). The OK flag indicates that the information in the control-value table belonging to the set time zone does not need to be updated. Therefore, the in-use calibration on the second day ends.

On the other hand, in a case in which the frequency of an RTC signal for any time zone exceeds the allowable error, the update determiner 205 sets an NG flag for the time zone in the control-value table and sets an OK flag for each of the other time zones (step S24). The NG flag indicates that the information of the control-value table belonging to the set time zone needs to be updated. In this case, the temperature acquirer 202 acquires the ambient temperature of the RTC generation device 200 for the time zone from the temperature outputter 60 (step S25). Further, based on the ambient temperature acquired in the step S25 and the operation schedule acquired in the step S12, the temperature acquirer 202 acquires the internal temperature of the RTC generation device 200 for the time zone (step S26).

Next, based on the internal temperature of the RTC generation device 200 for the time zone acquired in the step S26, the division ratio definer 203 compensates the integer division ratio and the decimal division ratio of a reference clock signal for the time zone (step S27). Subsequently, using the integer division ratio and the decimal division ratio compensated in the step S27, the table acquirer 204 updates the control-value table stored in the RAM 40 (step S28). Specifically, in the control-value table, the compensated integer division ratio and the compensated decimal division ratio for the time zone in which the frequency of an RTC signal exceeds the allowable error are respectively rewritten to the integer division ratio and the decimal division ratio compensated in the step S27. Further, for the time zone, the temperatures acquired in the steps S11 and S13 are also respectively updated to the temperatures acquired in the steps S25 and S26.

In this case, by reading the updated control-value table, the divider 103 divides a reference clock signal by the compensated integer division ratio and the compensated decimal division ratio to generate a RTC signal. Further, the frequency measurer 102 measures the frequency of the RTC signal using a measurement clock signal. Thus, the in-use calibration on the second day ends. Because it takes about 24 hours to execute the step S21, it takes about one day to execute the steps S21 to S28.

Figure 6:
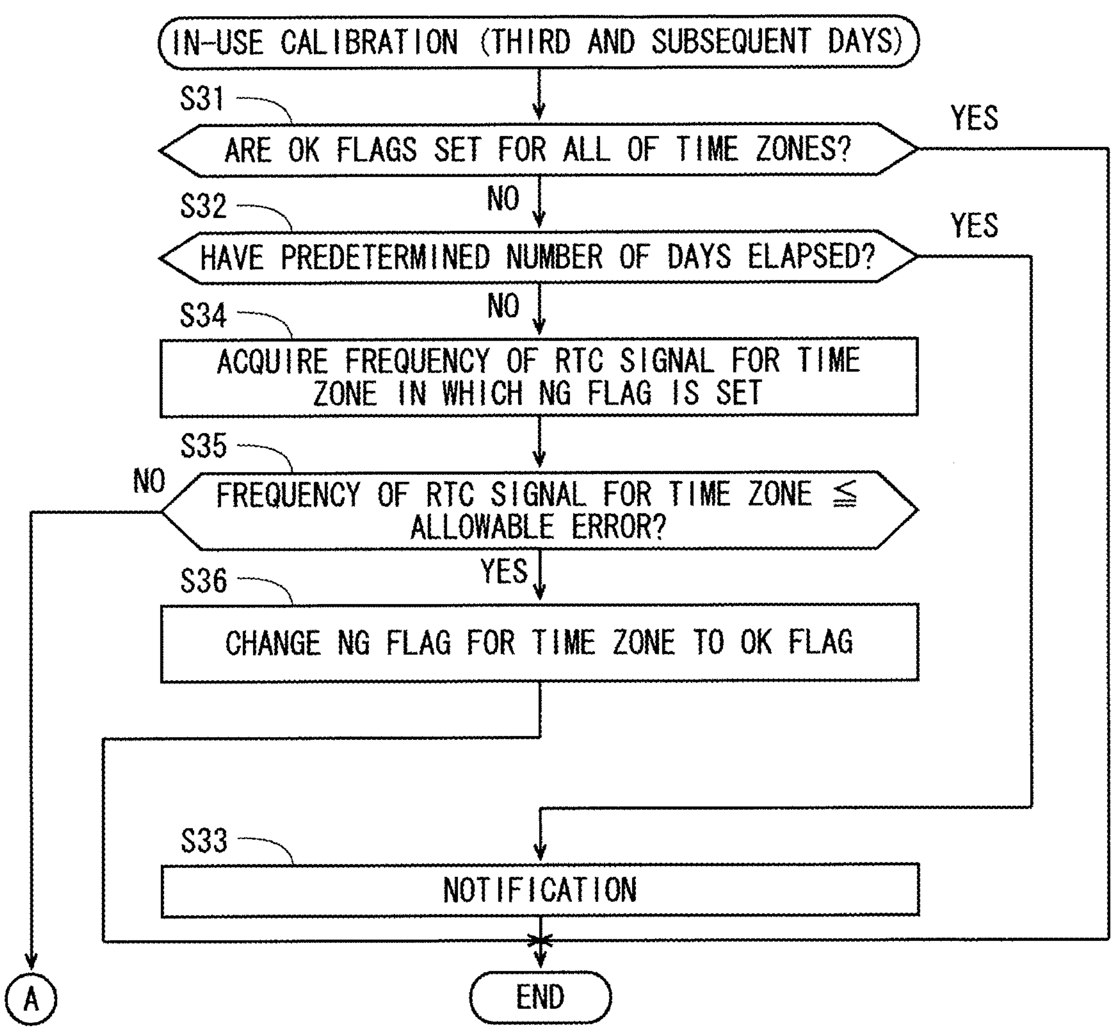
FIG. 6 is a flowchart showing one example of in-use calibration on the third and subsequent days executed by the CPU.
Figure 7:
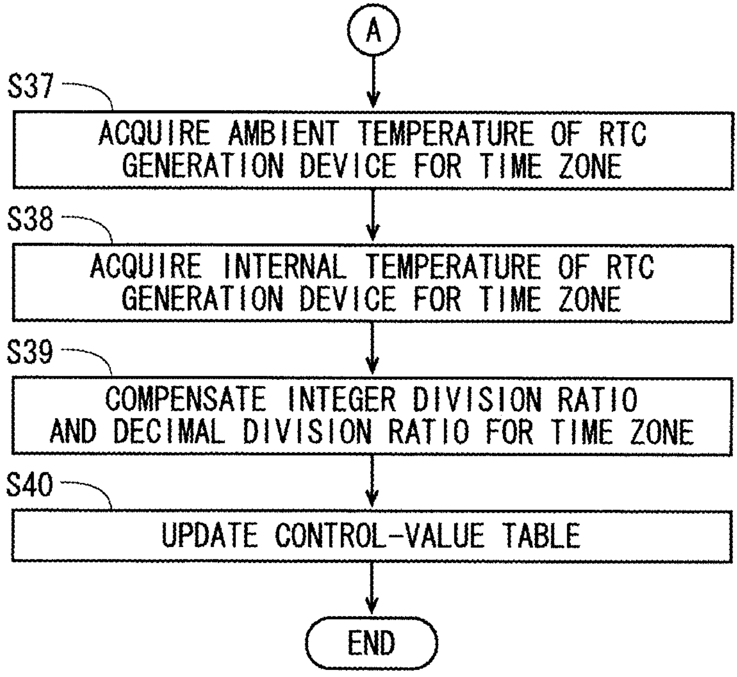
FIG. 7 is a flowchart showing one example of the in-use calibration on the third and subsequent days executed by the CPU.

After the in-use calibration on the second day ends, the in-use calibration on the third and subsequent days is executed. FIGS. 6 and 7 are flowcharts showing one example of the in-use calibration on the third and subsequent days executed by the CPU 20. In the in-use calibration on the third and subsequent days, the update determiner 205 determines whether OK flags are set for all of the time zones in the control-value table (step S31). In a case in which OK flags are set for all of the time zones, the in-use calibration on the third and subsequent days ends.

In a case in which an NG flag is set for any time zone, the abnormality determiner 207 determines whether a predetermined number of days have elapsed from the start of the in-use calibration (step S32). In a case in which the predetermined number of days have elapsed, the abnormality determiner 207 determines that an abnormality has occurred in the RTC generation device 200, and notifies the user of the determination result (step S33). Also in this case, the in-use calibration ends.

In a case in which the predetermined number of days have not elapsed, the update determiner 205 acquires the frequency of an RTC signal for the time zone in which an NG flag is set, with the frequency being measured by the frequency measurer 102 (step S34). Further, the update determiner 205 determines whether the frequency of the RTC signal for the time zone acquired in the step S34 is equal to or smaller than a predetermined allowable error (step S35). In a case in which the frequency of the RTC signal for the time zone is equal to or smaller than the allowable error, the update determiner 205 changes the NG flag for the time zone in the control-value table to an OK flag (step S36). Thus, the in-use calibration on the third and subsequent days ends.

In the step S35, in a case in which the frequency of the RTC signal for the time zone exceeds the allowable error, the steps S37 to S40 respectively similar to the steps S25 to S28 are executed. Thus, the in-use calibration on the third day ends. In this case, the in-use calibration of FIGS. 6 and 7 is also executed on the fourth and subsequent days. The in-use calibration of FIGS. 6 and 7 is repeated until an OK flag is set for each of all of the time zones in the control-value table or until the user is notified of an abnormality in the RTC generation device 200 when a predetermined number of days elapse from the start of the in-use calibration.

In the present example, in a case in which an OK flag is set for each of all of the time zones in the control-value table, the in-use calibration ends. Therefore, although the in-use calibration of FIGS. 6 and 7 is not executed on the fourth and subsequent days, the embodiment is not limited to this. Even in a case in which an OK flag is set for each of all of the time zones in the control-value table, the in-use calibration of FIGS. 6 and 7 may be executed on the fourth and subsequent days. In this case, the in-use calibration ends immediately after the step S31 is executed.

In the in-use calibration of FIGS. 4 to 7, after the control-value table is created, the RTC generation device 200 can perform a normal operation. During the normal operation, the divider 103 reads the control-value table stored in the RAM 40, and divides a reference clock signal output from the ring oscillator 80 by the integer division ratio and the decimal division ratio corresponding to a current point in time, thereby being able to generate an RTC signal. Even in a case in which the RTC generation device 200 is switched to the sleep mode, the RTC signal is generated at all times and continuously output.

Figure 8:
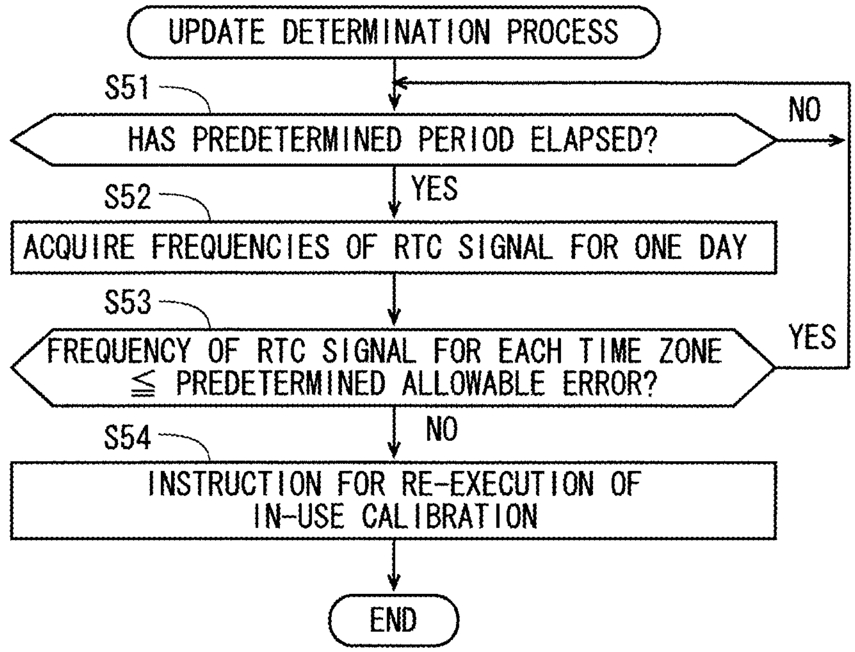
FIG. 8 is a flowchart showing one example of an update determination process executed by the CPU.

The update determination process, the temperature determination process and the abnormality determination process are periodically executed during the normal operation after the in-use calibration ends. FIG. 8 is a flowchart showing one example of the update determination process executed by the CPU 20. In the update determination process, the update determiner 205 determines whether a predetermined period (one month, for example) has elapsed from the end of in-use calibration (step S51). In a case in which the predetermined period has not elapsed, the update determiner 205 waits until the predetermined period elapses.

In a case in which the predetermined period has elapsed, the update determiner 205 acquires the frequencies of the RTC signal for one day measured by the frequency measurer 102 (step S52). Further, the update determiner 205 determines whether the frequency of an RTC signal for each time zone acquired in the step S52 is equal to or smaller than a predetermined allowable error (step S53).

In a case in which the frequency of an RTC signal for each time zone is equal to or smaller than the allowable error, the process returns to the step S51. In a case in which the frequency of an RTC signal for any time zone exceeds the allowable error, the update determiner 205 instructs the temperature acquirer 202 or the like to re-execute in-use calibration in order to update a control parameter (step S54), and ends the update determination process. Thus, the in-use calibration of FIGS. 4 to 7 is re-executed.

Figure 9:
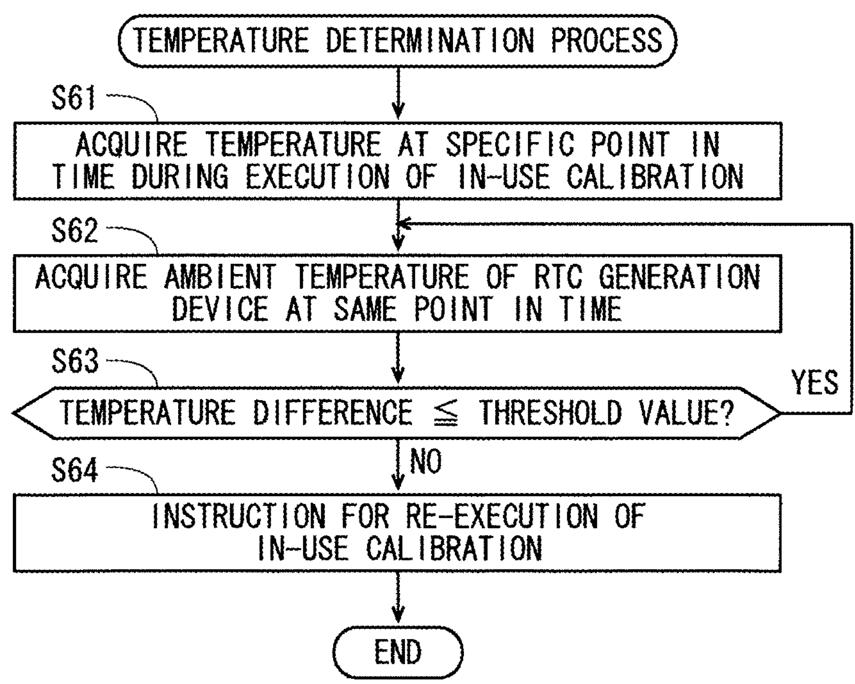
FIG. 9 is a flowchart showing one example of a temperature determination process executed by the CPU.

FIG. 9 is a flowchart showing one example of the temperature determination process executed by the CPU 20. In the temperature determination process, the temperature determiner 206 acquires an ambient temperature of the RTC generation device 200 at a specific point in time during execution of in-use calibration (step S61). The temperature can be acquired from the control-value table stored in the RAM 40. Next, the temperature acquirer 202 acquires an ambient temperature of the RTC generation device 200 at the same point time from the temperature outputter 60 (step S62).

Subsequently, the temperature determiner 206 determines whether the difference between the temperature acquired in the step S61 and the temperature acquired in the step S62 is equal to or smaller than a threshold value (step S63). In a case in which the temperature difference is equal to or smaller than the threshold value, the process returns to the step S62. In this case, the step S62 is executed again at the same point in time on the next day. On the other hand, in a case in which the temperature difference exceeds the threshold value, the temperature determiner 206 instructs the temperature acquirer 202 or the like to re-execute in-use calibration (step S64), and ends the temperature determination process. Thus, the in-use calibration of FIGS. 4 to 7 is re-executed.

Figure 10:
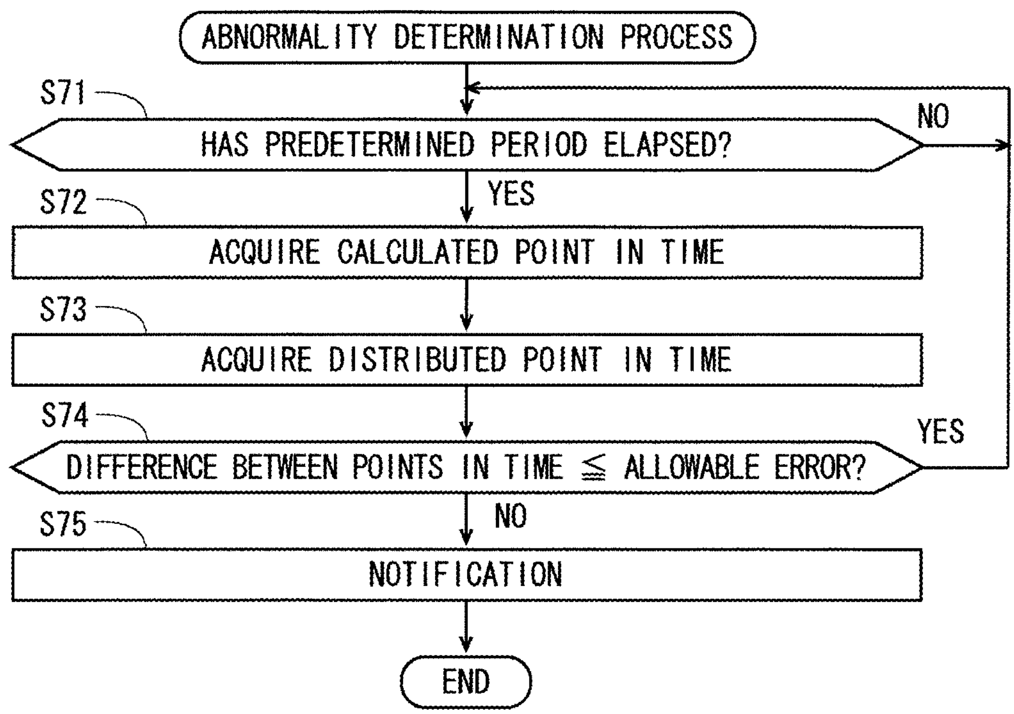
FIG. 10 is a flowchart showing one example of an abnormality determination process executed by the CPU.

FIG. 10 is a flowchart showing one example of the abnormality determination process executed by the CPU 20. In the abnormality determination process, the abnormality determiner 207 determines whether a predetermined period has elapsed from the date of manufacture of the RTC generation device 200 (step S71). In a case in which the predetermined period has not elapsed, the abnormality determiner 207 waits until the predetermined period elapses. The longer a period of time that has elapsed from the date of manufacture of the RTC generation device 200 is, the shorter the period may be.

In a case in which the predetermined period has elapsed, the abnormality determiner 207 acquires a point in time calculated by the point-in-time calculator 104 (step S72). Further, the abnormality determiner 207 acquires a point in time distributed by communication from the communication chip 300 through the communication I/F 50 (step S73). The step S72 and the step S73 are executed substantially at the same time. Next, the abnormality determiner 207 determines whether the difference between the point in time acquired in the step S72 and the point in time acquired in the step S73 is equal to or smaller than an allowable error (step S74).

In a case in which the difference between the points in time is equal to or smaller than the allowable error, the process returns to the step S71. At this time, the point-in-time calculator 104 may update the calculated point in time with the point in time acquired in the step S73. In a case in which the difference between the points in time exceeds the allowable error, the abnormality determiner 207 determines that an abnormality has occurred in the RTC generation device 200, and notifies the user of the determination result (step S75). Thus, the abnormality determination process ends.

4. Effects

In the RTC generation device 200 according to the present embodiment, the table acquirer 204 acquires a control-value table representing the correspondences between the time zone in which the ring oscillator 80 outputting a reference clock signal operates and the division ratio of the reference clock signal. The divider 103 generates an RTC signal by changing, in accordance with the control-value table, the division ratio of the reference clock signal for each time zone in which the ring oscillator 80 operates.

During execution of the in-use calibration, the frequency measurer 102 measures the frequency of an RTC signal based on a measurement clock signal that is output by the ring oscillator 90 and oscillates more accurately than a reference clock signal. The update determiner 205 determines whether the frequency of the RTC signal is equal to or smaller than a predetermined allowable error. In a case in which the frequency of the RTC signal exceeds the allowable error, at least part of the division ratios in the control-value table is updated. In a case in which the frequency of the RTC signal is equal to or smaller than the allowable error, the in-use calibration ends.

With the RTC generation device 200, it is not necessary to provide a crystal oscillator. Therefore, the RTC generation device 200 can be made compact and inexpensive, and power consumption can be reduced. Further, the division ratios in the control-value table are updated based on a measurement clock signal that oscillates more accurately than a reference clock signal. This maintains the accuracy of the RTC signal. Furthermore, because it is not necessary to drive the ring oscillator 90 after the end of the in-use calibration, the power consumption is further reduced. As a result, it is possible to generate a RTC signal using the RTC generation device 200 that is configured to have low power consumption, be small and be inexpensive while maintaining accuracy.

Further, the temperature acquirer 202 acquires an operating temperature of the ring oscillator 80 for each time zone in which the ring oscillator 80 operates. Based on the operating temperature of the ring oscillator 80 acquired by the temperature acquirer 202, the division ratio definer 203 defines the division ratio of a reference clock signal for each time zone in which the ring oscillator 80 operates. A control-value table acquired by the table acquirer 204 represents the correspondences between a time zone in which the ring oscillator 80 operates and the division ratio of a reference clock signal defined by the division ratio definer 203. In this case, variations in frequencies of the RTC signal caused by variations in operating temperatures of the ring oscillator 80 are reduced. Thus, the accuracy of an RTC signal can be maintained more easily.

In a case in which the frequency of an RTC signal for a certain time zone exceeds an allowable error, an operating temperature of the ring oscillator 80 for the time zone is acquired again by the temperature acquirer 202. Based on the operating temperature of the ring oscillator 80 for the time zone that is acquired again by the temperature acquirer 202, the division ratio definer 203 re-defines (compensates) the division ratio of a reference clock signal for the time zone. Based on the division ratio of the reference clock signal that is re-defined by the division ratio definer 203, the division ratio for the time zone in the control-value table is updated. In this case, the division ratio for the time zone in which the frequency of an RTC signal exceeds the allowable error is updated, and the division ratios for the other time zones are fixed without being updated. Thus, the in-use calibration can be executed efficiently.

Further, the frequency of a reference clock signal measured at a specific temperature is acquired by the frequency measurer 102. A control-value table acquired by the table acquirer 204 represents the correspondences between the time zone in which the ring oscillator 80 operates and the division ratio with respect to the frequency of a reference clock signal acquired by the frequency measurer 102. In this case, variations in frequencies of the reference clock signal for respective RTC generation devices 200 caused by a difference in manufacturing process of RTC generation devices 200 are reduced. Thus, the accuracy of an RTC signal can be maintained more easily.

Here, the frequency measurer 102 is temporarily connected to the external measurement device 500 that outputs an external clock signal that oscillates more accurately than a reference clock signal during initial calibration before execution of in-use calibration. The frequency measurer 102 measures the frequency of a reference clock signal based on an external clock signal. The frequency acquirer 201 acquires the frequency of a reference clock signal measured by the frequency measurer 102. In this case, it is possible to acquire the frequency of a reference clock signal more accurately using the external measurement device 500 such as a crystal oscillator while maintaining the RTC generation device compact and inexpensive.

Further, a division ratio includes an integer division ratio and a decimal division ratio. The division ratio definer 203 defines an integer division ratio based on the frequency of a reference clock signal and the frequency of a measurement clock signal. In this case, a division ratio for generating a RTC signal can be easily defined. The division ratio definer 203 defines a decimal division ratio as a division ratio for bringing the frequency of a reference clock signal (integer division signal) that is divided by the integer division ratio close to a specific frequency with resolution smaller than the integer division ratio. Thus, a division ratio for generating an RTC signal can be defined more accurately. Here, an RTC signal is generated when the decimal division ratio of a reference clock signal is changed by the PWM control of the divider 103. The decimal division ratio includes a duty ratio in the pulse width modulation control. In this case, an RTC signal can be generated by simple control.

Further, when a voltage is supplied from the external power supply 400 to the reference voltage source 70, a voltage having higher stability than that of a supplied voltage is generated by the reference voltage source 70, and the generated voltage is supplied to the ring oscillator 80. In this case, variations in frequencies of the reference clock signal caused by variations in voltages of the external power supply 400 are reduced. Thus, the accuracy of an RTC signal can be maintained more easily.

Further, the RTC generation device 200 is sectioned into a power domain 120 and a power domain 130 which are different from each other. The ring oscillator 80 and the divider 103 are arranged in the power domain 120, and the ring oscillator 90 and the update determiner 205 are arranged in the power domain 130. In this case, after the end of in-use calibration, it is possible to easily stop the operations of the ring oscillator 90, the update determiner 205 and the like while continuing generation of an RTC signal. Thus, power consumption can be easily reduced.

Further, after the end of in-use calibration, the update determiner 205 determines whether the frequency of an RTC signal periodically measured by the frequency measurer 102 exceeds an allowable error. In a case in which the frequency of an RTC signal exceeds the allowable error, in-use calibration is restarted. In this case, after the in-use calibration ends, it is possible to prevent the accuracy of an RTC signal from being reduced.

Further, after the in-use calibration ends, the temperature determiner 206 determines whether an ambient temperature of the RTC generation device 200 at a predetermined point in time is equal to or smaller than a predetermined threshold value. In the present example, it is determined whether the difference between the ambient temperature of the RTC generation device 200 and the temperature recorded in a control-value table as the temperature corresponding to the predetermined point in time is equal to or smaller than a threshold value. In a case in which the temperature exceeds the threshold value, in-use calibration is restarted. In this case, after the in-use calibration ends, it is possible to prevent the accuracy of an RTC signal from being reduced even in a case in which the installation environment of the RTC generation device 200 has changed.

Further, in a case in which in-use calibration does not end within a predetermined period after the in-use calibration is started, the abnormality determiner 207 determines that the RTC generation device 200 is abnormal. In this case, it is possible to easily determine an initial abnormality in the RTC generation device 200. Further, the point-in-time calculator 104 calculates a point in time based on an RTC signal generated by the divider 103. In a case in which the difference between a point in time calculated by the point-in-time calculator 104 and an externally distributed point in time exceeds a predetermined allowable error, the abnormality determiner 207 determines that the RTC generation device 200 is abnormal. In this case, it is possible to easily determine an abnormality over time in the RTC generation device 200.

5. Other Embodiments (1) In the above-mentioned embodiment, the RTC generation device 200 is connected to the external measurement device 500 during initial calibration, and the frequency of a reference clock signal is measured using an external clock signal output from the external measurement device 500. However, embodiments are not limited to this. The RTC generation device 200 does not have to be connected to the external measurement device 500 during initial calibration. In this case, during initial calibration, the frequency of a reference clock signal is measured using a measurement clock signal output from the ring oscillator 90. Further, initial calibration may be executed using the ring oscillator 90 at the shipping destination of the RTC generation device 200 after the RTC generation device 200 is shipped.

(2) While a control-value table in an initial state is acquired when the table acquirer 204 generates the control-value table in the above-mentioned embodiment, the embodiment is not limited to this. The control-value table in the initial state may be stored in the ROM 30 in advance. In this case, the table acquirer 204 acquires the control-value table in the initial state from the ROM 30.

(3) While ambient temperatures of the RTC generation device 200 are acquired at intervals of 1 hour in the above-mentioned embodiment, the embodiment is not limited to this. Temperatures may be acquired at intervals shorter than 1 hour or longer than 1 hour, for example. Alternatively, the smaller the difference between the highest value and the lowest value of temperatures for one day, the longer the intervals at which temperatures are acquired. Further, in a case in which the intervals at which temperatures are acquired is 30 minutes, for example, a control parameter is defined every 30 minutes and is written in a control-value table. Similarly, in a case in which the intervals at which temperatures are acquired is 2 hours, for example, a control parameter is defined every 2 hours and is written in a control-value table.

(4) The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

6. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of constituent elements recited in the claims, various other elements having configurations or functions described in the claims can be also used.

In the above-mentioned embodiment, the ring oscillators 80, 90 are respectively examples of a first ring oscillator and a second ring oscillator, the table acquirer 204 is an example of a table acquirer, the divider 103 is an example of a divider, the frequency measurer 102 is an example of a frequency measurer, and the update determiner 205 is an example of an update determiner. The RTC generation device 200 is an example of a real-time clock generation device, the temperature acquirer 202 is an example of a temperature acquirer, the division ratio definer 203 is an example of a division ratio definer, and the frequency acquirer 201 is an example of a frequency acquirer.

The external measurement device 500 is an example of an external measurement device, and the reference voltage source 70 is an example of a reference voltage source. The power domains 120, 130 are respectively examples of a first power domain and a second power domain, the temperature determiner 206 is an example of a temperature determiner, the abnormality determiner 207 is an example of an abnormality determiner, and the point-in-time calculator 104 is an example of a point-in-time calculator.

7. Overview of Embodiments (Item 1) A real-time clock generation device according to item 1 includes a first ring oscillator that outputs a reference clock signal, a table acquirer that acquires a control-value table representing a correspondence between time zones in which the first ring oscillator operates and division ratios of the reference clock signal, a divider that, in accordance with the control-value table, generates a real-time clock signal by changing the division ratio of the reference clock signal for each time zone in which the first ring oscillator operates, a second ring oscillator that, during execution of calibration of the control-value table, outputs a measurement clock signal that oscillates more accurately than the reference clock signal, a frequency measurer that measures a frequency of the real-time clock signal based on the measurement clock signal, and an update determiner that determines whether a frequency of the real-time clock signal measured by the frequency measurer is equal to or smaller than a predetermined allowable error, updates at least part of the division ratios in the control-value table in a case in which the frequency of the real-time clock signal exceeds the allowable error, and ends the calibration in a case in which the frequency of the real-time clock signal is equal to or smaller than the allowable error.

With this real-time clock generation device, it is not necessary to provide a crystal oscillator. Therefore, the real-time clock generation device can be made compact and inexpensive, and the power consumption can be reduced. Further, the division ratios in the control-value table are updated based on a measurement clock signal that oscillates more accurately than a reference clock signal. This maintains the accuracy of a real-time clock signal. Furthermore, because it is not necessary to drive the second ring oscillator after calibration ends, the power consumption is further reduced. As a result, it is possible to generate a real-time clock signal using a device that is configured to have low power consumption, be small and be inexpensive while maintaining accuracy.

(Item 2) The real-time clock generation device according to item 1, may further include a temperature acquirer that acquires an operating temperature of the first ring oscillator for each time zone in which the first ring oscillator operates, and a division ratio definer that, based on an operating temperature of the first ring oscillator acquired by the temperature acquirer, defines the division ratio of the reference clock signal for each time zone in which the first ring oscillator operates, wherein the table acquirer may acquire the control-value table representing a correspondence between time zones in which the first ring oscillator operates and the division ratios of the reference clock signal defined by the division ratio definer.

In this case, variations in frequencies of the real-time clock signal caused by variations in operating temperatures of the first ring oscillator are reduced. Thus, the accuracy of the real-time clock signal can be maintained more easily.

(Item 3) The real-time clock generation device according to claim 2, wherein the temperature acquirer, in a case in which the update determiner determines that a frequency of the real-time clock signal in a certain time zone has exceeded the allowable error, may re-acquire an operating temperature of the first ring oscillator for the time zone, and the division ratio definer, based on an operating temperature of the first ring oscillator for the time zone that is re-acquired by the temperature acquirer, may update the division ratio for the time zone in the control-value table.

In this case, the division ratio for the time zone in which the frequency of a real-time clock signal exceeds the allowable error is updated, and the division ratios for the other time zones are fixed without being updated. Thus, calibration can be executed efficiently.

(Item 4) The real-time clock generation device according to any one of items 1 to 3, may further include a frequency acquirer that acquires a frequency of the reference clock signal, wherein the table acquirer may acquire the control-value table representing a correspondence between time zones in which the first ring oscillator operates and the division ratios with respect to frequencies of the reference clock signal acquired by the frequency acquirer.

In this case, variations in frequencies of the reference clock signal for respective devices due to the difference in manufacturing process of real-time clock generation devices are reduced. Thus, the accuracy of a real-time clock signal can be maintained more easily.

(Item 5) The real-time clock generation device according to item 4, wherein before execution of the calibration of the control-value table, the frequency measurer may be temporarily connected to an external measurement device that outputs an external clock signal oscillating more accurately than the reference clock signal, and further measures a frequency of the reference clock signal based on the external clock signal, and the frequency acquirer may acquire a frequency of the reference clock signal measured by the frequency measurer.

In this case, it is possible to acquire the frequency of a reference clock signal more accurately using the external measurement device while maintaining the real-time clock generation device be compact and inexpensive.

(Item 6) The real-time clock generation device according to any one of items 1 to 5, wherein the division ratio may include an integer division ratio defined based on a frequency of the reference clock signal.

In this case, the division ratio for generating a real-time clock signal can be easily defined.

(Item 7) The real-time clock generation device according to item 6, wherein the division ratio may further include a decimal division ratio for bringing a frequency of the reference clock signal that is divided by the integer division ratio to be closer to a specific frequency with resolution smaller than that of the integer division ratio.

In this case, the division ratio for generating a real-time clock signal can be defined more accurately.

(Item 8) The real-time clock generation device according to item 7, wherein the divider may generate the real-time clock signal by changing the decimal division ratio of the reference clock signal by pulse width modulation control, and the decimal division ratio may include a duty ratio in the pulse width modulation control.

In this case, a real-time clock signal can be generated with simple control.

(Item 9) The real-time clock generation device according to any one of items 1 to 8, may further include a reference voltage source that, when a voltage is supplied from an external power supply, generates a voltage having higher stability than that of the supplied voltage, and supplies the generated voltage to the first ring oscillator.

In this case, variations in frequencies of the reference clock signal caused by variations in voltages of the external power supply are reduced. Thus, the accuracy of a real-time clock signal can be maintained more easily.

(Item 10) The real-time clock generation device according to any one of items 1 to 9, wherein the real-time clock generation device may be sectioned into a first power domain and a second power domain that are different from each other, the first ring oscillator and the divider may be arranged in the first power domain, and the second ring oscillator and the update determiner may be arranged in the second power domain.

In this case, after calibration ends, it is possible to easily stop the operations of the second ring oscillator and the update determiner while continuing to generate a real-time clock signal. Thus, power consumption can be easily reduced.

(Item 11) The real-time clock generation device according to any one of items 1 to 10, wherein the update determiner, after the calibration ends, may determine whether a frequency of the real-time clock signal periodically measured by the frequency measurer exceeds the allowable error, and may restart the calibration in a case in which the frequency of the real-time clock signal exceeds the allowable error.

In this case, after calibration ends, it is possible to prevent the accuracy of a real-time clock signal from being reduced.

(Item 12) The real-time clock generation device according to any one of items 1 to 11, may further include a temperature determiner that, after the calibration ends, determines whether an ambient temperature of the real-time clock generation device at a predetermined point in time is equal to or smaller than a predetermined threshold value, and restarts the calibration in a case in which the temperature exceeds the threshold value.

In this case, even in a case in which the installation environment of the real-time clock generation device is changed after the end of calibration, it is possible to prevent the accuracy of a real-time clock signal from being reduced.

(Item 13) The real-time clock generation device according to any one of items 1 to 12, may further include an abnormality determiner that determines that the real-time clock generation device is abnormal in a case in which the calibration does not end within a predetermined period after the calibration is started.

In this case, it is possible to easily determine an abnormality of an early stage in the real-time clock generation device.

(Item 14) The real-time clock generation device according to any one of items 1 to 13, may further include a point-in-time calculator that calculates a point in time based on the real-time clock signal generated by the divider, and an abnormality determiner that, in a case in which a difference between a point in time calculated by the point-in-time calculator and an externally distributed point in time exceeds a predetermined allowable error, determines that the real-time clock generation device is abnormal.

In this case, it is possible to easily determine an abnormality over time in the real-time clock generation device.

(Item 15) A real-time clock generation method according to item 15 includes acquiring a control-value table representing a correspondence between time zones in which a first ring oscillator outputting a reference clock signal operates and division ratios of the reference clock signal, in accordance with the control-value table, changing the division ratio of the reference clock signal for each time zone in which the first ring oscillator operates to generate a real-time clock signal, during execution of calibration of the control-value table, measuring a frequency of the real-time clock signal based on a measurement clock signal that is output by a second ring oscillator and oscillates more accurately than the reference clock signal, in a case in which a frequency of the real-time clock signal exceeds an allowable error, updating at least part of the division ratios in the control-value table, and in a case in which a frequency of the real-time clock signal is equal to or smaller than the allowable error, ending the calibration.

With this real-time clock generation method, it is not necessary to provide a crystal oscillator. Further, the division ratios in the control-value table are updated based on a measurement clock signal that oscillates more accurately than a reference clock signal. Thus, it is possible to generate a real-time clock signal using the device that is configured to have low power consumption, be small and be inexpensive while maintaining accuracy.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A real-time clock generation device comprising:

a first ring oscillator that outputs a reference clock signal;

a table acquirer that acquires a control-value table representing a correspondence between time zones in which the first ring oscillator operates and division ratios of the reference clock signal;

a divider that, in accordance with the control-value table, generates a real-time clock signal by changing the division ratio of the reference clock signal for each time zone in which the first ring oscillator operates;

a second ring oscillator that, during execution of calibration of the control-value table, outputs a measurement clock signal that oscillates more accurately than the reference clock signal;

a frequency measurer that measures a frequency of the real-time clock signal based on the measurement clock signal; and an update determiner that determines whether a frequency of the real-time clock signal measured by the frequency measurer is equal to or smaller than a predetermined allowable error, updates at least part of the division ratios in the control-value table in a case in which the frequency of the real-time clock signal exceeds the allowable error, and ends the calibration in a case in which the frequency of the real-time clock signal is equal to or smaller than the allowable error.

2. The real-time clock generation device according to claim 1, further comprising:

a temperature acquirer that acquires an operating temperature of the first ring oscillator for each time zone in which the first ring oscillator operates; and a division ratio definer that, based on an operating temperature of the first ring oscillator acquired by the temperature acquirer, defines the division ratio of the reference clock signal for each time zone in which the first ring oscillator operates, wherein the table acquirer acquires the control-value table representing a correspondence between time zones in which the first ring oscillator operates and the division ratios of the reference clock signal defined by the division ratio definer.

3. The real-time clock generation device according to claim 2, wherein the temperature acquirer, in a case in which the update determiner determines that a frequency of the real-time clock signal in a certain time zone has exceeded the allowable error, re-acquires an operating temperature of the first ring oscillator for the time zone, and the division ratio definer, based on an operating temperature of the first ring oscillator for the time zone that is re-acquired by the temperature acquirer, updates the division ratio for the time zone in the control-value table.

4. The real-time clock generation device according to claim 1, further comprising a frequency acquirer that acquires a frequency of the reference clock signal, wherein the table acquirer acquires the control-value table representing a correspondence between time zones in which the first ring oscillator operates and the division ratios with respect to frequencies of the reference clock signal acquired by the frequency acquirer.

5. The real-time clock generation device according to claim 4, wherein before execution of the calibration of the control-value table, the frequency measurer is temporarily connected to an external measurement device that outputs an external clock signal oscillating more accurately than the reference clock signal, and further measures a frequency of the reference clock signal based on the external clock signal, and the frequency acquirer acquires a frequency of the reference clock signal measured by the frequency measurer.

6. The real-time clock generation device according to claim 1, wherein the division ratio includes an integer division ratio defined based on a frequency of the reference clock signal.

7. The real-time clock generation device according to claim 6, wherein the division ratio further includes a decimal division ratio for bringing a frequency of the reference clock signal that is divided by the integer division ratio to be closer to a specific frequency with resolution smaller than that of the integer division ratio.

8. The real-time clock generation device according to claim 7, wherein the divider generates the real-time clock signal by changing the decimal division ratio of the reference clock signal by pulse width modulation control, and the decimal division ratio includes a duty ratio in the pulse width modulation control.

9. The real-time clock generation device according to claim 1, further comprising a reference voltage source that, when a voltage is supplied from an external power supply, generates a voltage having higher stability than that of the supplied voltage, and supplies the generated voltage to the first ring oscillator.

10. The real-time clock generation device according to claim 1, wherein the real-time clock generation device is sectioned into a first power domain and a second power domain that are different from each other, the first ring oscillator and the divider are arranged in the first power domain, and the second ring oscillator and the update determiner are arranged in the second power domain.

11. The real-time clock generation device according to claim 1, wherein the update determiner, after the calibration ends, determines whether a frequency of the real-time clock signal periodically measured by the frequency measurer exceeds the allowable error, and restarts the calibration in a case in which the frequency of the real-time clock signal exceeds the allowable error.

12. The real-time clock generation device according to claim 1, further comprising a temperature determiner that, after the calibration ends, determines whether an ambient temperature of the real-time clock generation device at a predetermined point in time is equal to or smaller than a predetermined threshold value, and restarts the calibration in a case in which the temperature exceeds the threshold value.

13. The real-time clock generation device according to claim 1, further comprising an abnormality determiner that determines that the real-time clock generation device is abnormal in a case in which the calibration does not end within a predetermined period after the calibration is started.

14. The real-time clock generation device according to claim 1, further comprising:

a point-in-time calculator that calculates a point in time based on the real-time clock signal generated by the divider; and an abnormality determiner that, in a case in which a difference between a point in time calculated by the point-in-time calculator and an externally distributed point in time exceeds a predetermined allowable error, determines that the real-time clock generation device is abnormal.

15. A real-time clock generation method including:

acquiring a control-value table representing a correspondence between time zones in which a first ring oscillator outputting a reference clock signal operates and division ratios of the reference clock signal;

in accordance with the control-value table, changing the division ratio of the reference clock signal for each time zone in which the first ring oscillator operates to generate a real-time clock signal;

during execution of calibration of the control-value table, measuring a frequency of the real-time clock signal based on a measurement clock signal that is output by a second ring oscillator and oscillates more accurately than the reference clock signal;

in a case in which a frequency of the real-time clock signal exceeds an allowable error, updating at least part of the division ratios in the control-value table; and in a case in which a frequency of the real-time clock signal is equal to or smaller than the allowable error, ending the calibration.

* * * * *